United States Patent [19]

Aichelman, Jr. et al.

[11] Patent Number: 4,992,979
[45] Date of Patent: * Feb. 12, 1991

[54] MEMORY STRUCTURE FOR NONSEQUENTIAL STORAGE OF BLOCK BYTES IN MULTI BIT CHIPS

[75] Inventors: Frederick J. Aichelman, Jr., Hopewell Junction; Vincent F. Sollitto, Jr., Rhinebeck, both of N.Y.

[73] Assignee: International Business Machines Corporation, Armonk, N.Y.

[*] Notice: The portion of the term of this patent subsequent to Jan. 3, 2006 has been disclaimed.

[21] Appl. No.: 231,813

[22] Filed: Aug. 12, 1988

Related U.S. Application Data

[63] Continuation of Ser. No. 791,833, Oct. 28, 1985, Pat. No. 4,796,222.

[51] Int. Cl.⁵ .............. G06F 9/3; G06F 13/16; G06F 12/04; G06F 12/06
[52] U.S. Cl. .................. 364/900; 364/961.1; 364/933; 364/958.3; 364/252; 364/254.9; 364/260; 364/247; 364/246.3; 364/252.1; 364/959.1; 364/966.4
[58] Field of Search .............. 365/230.03, 230.04; 364/200 MS File, 900 MS File

[56] References Cited

U.S. PATENT DOCUMENTS

| | | | |
|---|---|---|---|
| 4,092,728 | 5/1978 | Baltzer | 364/900 |
| 4,406,013 | 9/1983 | Reese et al. | |
| 4,438,493 | 3/1984 | Cushing et al. | 364/200 |
| 4,442,503 | 4/1984 | Schütt et al. | 364/900 |
| 4,450,538 | 5/1984 | Shirasaka | |
| 4,453,237 | 6/1984 | Reese et al. | |
| 4,467,443 | 8/1984 | Shima | |
| 4,561,072 | 12/1985 | Arakawa et al. | 365/230.03 |
| 4,580,214 | 4/1986 | Kubo et al. | 364/200 |
| 4,667,308 | 5/1987 | Hayes et al. | 365/230.03 X |
| 4,796,222 | 1/1989 | Aichelmann et al. | 364/900 |

OTHER PUBLICATIONS

European Search Report-86113662.0-07/25/89.
"Fault Tolerant Design Techniques for Semiconductor Memory Applications", F. J. Aichelmann, Jr., *IBM Journal of Research & Development*, vol. 28; No. 2, Mar. 1984.
"Paging from Multiple Bit Array Without Distributed Buffering", F. J. Aichelmann, Jr. *IBM Technical Disclosure Bulletin*, vol. 24, No. 1B, Jun. 1981.
"Memory Application of Multiple Bit Chips", F. J. Aichelmann, Jr., *IBM Technical Disclosure Bulletin*, vol., 24, No. 4, Sep. 1981.
"A 256K Dual Port Memory", Syoji Ishimoto et al., 8172, IEEE International Solid-State Circuits Conference, 28 (1985), Feb. 23.
"Bit Addressable Storage Access System", K. L. Coty and J. L. Quanstrom, *IBM Technical Disclosure Bulletin*, vol. 18, No. 9, Feb. 1976.
"New 64K Memory Chip Gets the Picture", Klaus J. Dimmler et al., *AT&T Bell Laboratories Record*, Jan. 85.

*Primary Examiner*—Archie E. Williams, Jr.
*Assistant Examiner*—Ayni Mohamed
*Attorney, Agent, or Firm*—Sughrue, Mion, Zinn, Macpeak & Seas

[57] ABSTRACT

A memory system for the transfer of a block of data, wherein the transfer of data can begin at a starting address anywhere within the block. The block is stored on two memory chips, each having multiple parallel outputs. The two chips are addressed by a common high order address bus and different low order address bus. The low order addresses are generated such that an ordered sequence of bits, beginning at the starting address, is transferred in parallel to the register from both chips, regardless of the starting address.

10 Claims, 4 Drawing Sheets

MEMORY STRUCTURE FOR NONSEQUENTIAL STORAGE OF BLOCK BYTES IN MULTI BIT CHIPS

This application is a continuation of application Ser. No. 06/791,833, filed Oct. 28, 1985, now U.S. Pat. No. 4,796,222.

BACKGROUND OF THE INVENTION

FIELD OF THE INVENTION

This invention relates generally to semiconductor memories. In particular, the invention relates to random access to memory chips having multi-bit outputs.

DESCRIPTION OF THE RELATED ART

In high end memory system applications, such as would be used in a large computer, one of the memory systems is the main store. The main store is typically a very large semiconductor memory system that is used to supply data and/or instructions to a cache memory. Typically, the main store is designed for block transfers of data. That is, there are multiple transfers of words constituting a block from the main store to the using system. The block transfer rate and the size of each transfer is unique to each particular application of the memory but the following comments appear to be general. The starting address of each multi-word block transfer is random with the initial fetch containing the requested memory coordinate. Once the transfer has started anywhere within the block, a wrap around is used to complete the transfer of the entire block, if necessary.

A typical design for a prior art memory system is shown in FIG. 1, which a user 10 is connected to the memory through an interface 12 which provides timing, control and data buffering logic to the memory. The memory consists of N memory arrays 14, connected in parallel to the interface 12. Usually, each memory array provides one parallel bit of data. The number N of memories arrays 14 is chosen to be equal to the number of bits in an ECC (error correction) word, 72 for many large IBM computers. Thus, each bit of an ECC word is stored in and fetched from a separate memory array 14. This configuration is implemented on the IBM computers Models 3030, 3080 and 3090.

When the memory arrays 14 are relatively small, block transfers are made possible by having each memory array 14 be implemented in 16 memory chips 16, as shown in FIG. 2. Each chip 16 provides one bit to a register 18. The bits are all transferred in parallel and after the initial transfer the block transfer to the using system can begin at a random address in the register 18. The memory architecture, as shown in FIG. 3, has N memory array groups 20, each consisting of 16 memory chips 16. The memory chips 16 are controlled over a common address and control bus 22 by address selection logic 24. Each memory array group 20 provides 16 bits in parallel to a data buffering circuit 26. When the 16 bits from each of the N memory array groups 20 have been buffered in a single transfer, the data is transferred to the using system in ECC words.

As memory arrays have become denser, the point has been reached where, for total required memory capacity, the number of memory arrays is reduced below the number necessary to support the 1-bit output configuration of FIGS. 2 and 3. One approach is to use multi-bit memories, that is, memory chips with multiple parallel output lines. Examples of multiple output memory chips are disclosed by Flanagan, et al. in U.S. Pat. Nos. 4,453,237 and 4,406,013. There are further advantages, such as testing, in using multi-output memories. As described by Aichelmann, one of the present inventors, in a technical article entitled "Fault-Tolerant Design Technique for Semiconductor Memory Applications" appearing in IBM Journal of Research and Development, Vol. 28, No. 2, March 1984 at pages 177–183, a single memory chip, even one having multiple outputs, should not provide more than 1 bit to an ECC word. This restriction prevents one failing chip from overwhelming the error correction capability. By default, in block transfers, the parallel bits of a multi-bit memory chip are used for different bits or words in the blocks. An example of this latter technique is described by Aichelmann in a technical article entitled "Paging From Multiple Bit Array Without Distributed Buffering", appearing in the IBM Technical Disclosure Bulletin, Volume 24, No. 1B, June 1981 at pages 485–488.

As illustrated in FIG. 4, a 4-bit memory chip 28 could transfer four bits of data at a time to a register 30. When the register 30 is filled, it contains all the bits associated with one of the N bits of the ECC word for a block transfer of 16 words. There would thus be N registers 30 in the data buffering circuit 26.

In block transfers, as previously mentioned, the requirements exist that the first word accessed be randomly addressable and that the entire block be eventually transferred. In the configuration of FIG. 4, the register 30 could be completely filled with 16 bits during four accesses to the memory chip 28 before any of those bits is randomly accessed. This approach introduces, however, an unacceptable delay in the initial access time $t_{ACCESS}$.

Alternatively, the transfers from the memory chip 28 can account for the initial address of the transfer, transferring first the addressed bit to the register 30 which can then immediately be transferred to the using system. An example of the timing associated with the selective addressing and immediate serialization is illustrated in FIG. 5, for which it is assumed that bit 5 (fifth ECC word of the block of 16) is the initial address. After the select signal addresses the bits 5 through 8 and enables the memory chip 28, the four bits 5 through 8 are transferred to the register 30. As soon as this transfer is completed, bit 5 is randomly addressed in the register 30 and read out to the using system. The time for the initial access is the access time $t_{ACCESS}$. Subsequently, the bits 6 through 8 are read out at a register reading rate period $t_N$, which is considerably shorter than the access time $t_{ACCESS}$.

The register reading rate period $t_N$ is considerably less than a chip reading rate period $t_{CAS}$. For example, $t_{CAS} = 4t_N$. However, while the bits are being transferred to the using system, another select signal can transfer bits 9 through 12 into the register 30. Accordingly, bit 9 is ready for serial transfer at the same reading rate period despite the disparity of the periods $t_n$ and $t_{CAS}$.

Unfortunately, the above description is valid only if the initial address is aligned to a lower 4-bit boundary. In the other extreme condition, the initial address is aligned with the upper 4-bit boundary. For instance, bit 8 is addressed. In this situation, the bits 5 through 8 are transferred to the register 30. The addressing circuitry associated with the register 30 immediately outputs bit 8 to the using system, as illustrated in FIG. 6, thus maintaining the access time $t_{ACCESS}$. However, because of the limitation on the chip reading rate period $t_{CAS}$, bit 9, the next to be serialized, is not immediately available. Instead, a gap time $t_{GAP}$ develops which can be several times the register reading rate period $t_N$, depending on what is the initial address.

Needless to say, the gap time $t_{GAP}$ is undesirable. It could be eliminated by lengthening the access time $t_{ACCESS}$ to allow a second buffering transfer. However, this lengthened access time is also undesirable.

SUMMARY OF THE INVENTION

Accordingly, an object of the this invention is to provide a memory system using multiple-output memory chips that can be used for block transfers.

A further object of this invention to provide such a memory system which eliminates gap times.

The invention can be summarized as a memory system using pairs of multiple-output memory chips in which the outputs of parallel chips are simultaneously transferred to a first register. The high order address of each of the memory chips is the same but the low order address may vary from chip to chip depending upon where the initial address of the block transfer is located. The contents of the first register can be quickly transferred to a second register. Either register can be read out one bit at a time.

Before the reading of the second register is completed, a subsequent transfer from the memory chips to the first register can be completed so that no gap times arise.

DETAILED DESCRIPTION OF THE PREFERRED EMBODIMENTS

Figure 1:
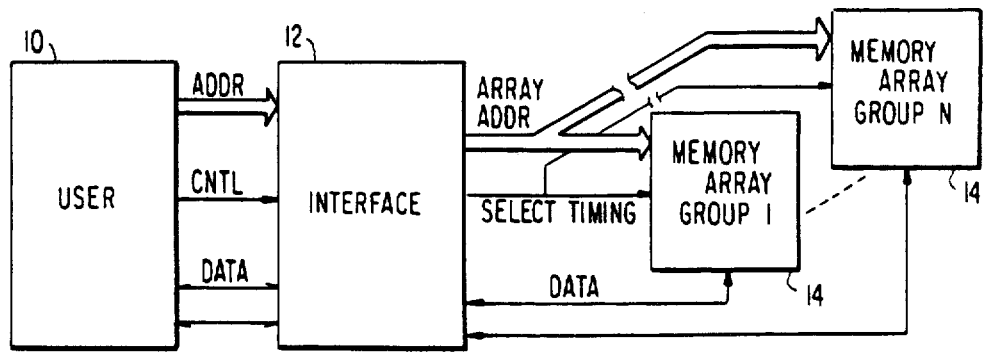
FIG. 1 is a block diagram of a computer system.
Figure 2:
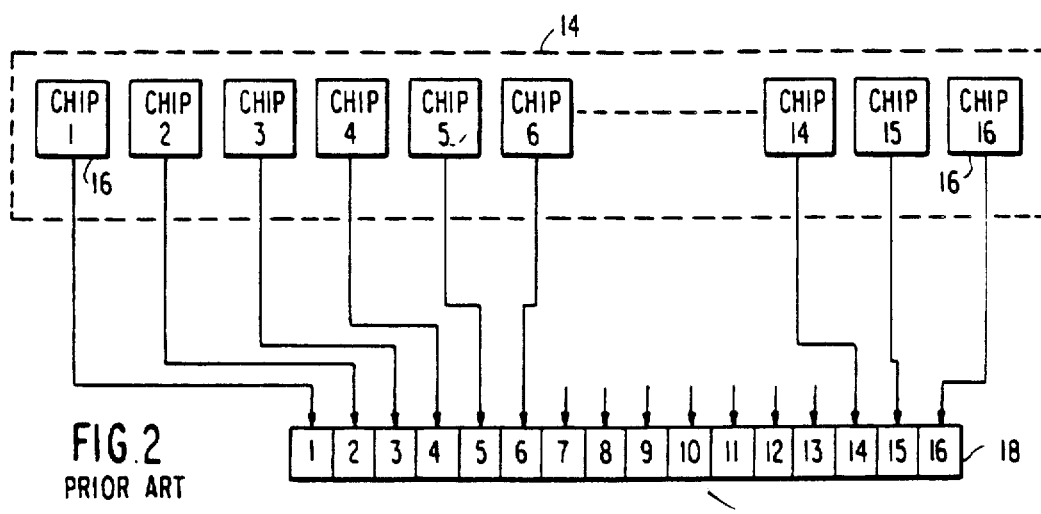
FIG. 2 is a diagram of one-bit memory chips as used for block transfers.
Figure 3:
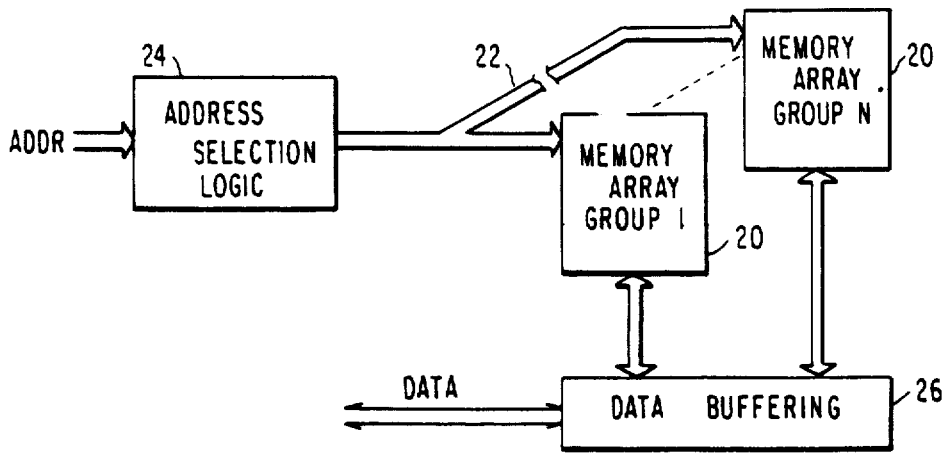
FIG. 3 is a block diagram of a block transfer memory system of the prior art.
Figure 4:
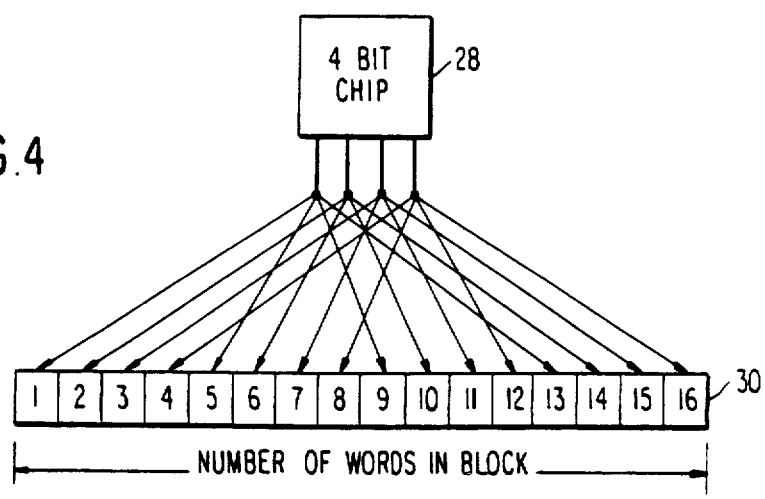
FIG. 4 is a diagram of a multi-bit memory chip used for block transfers.
Figure 5:
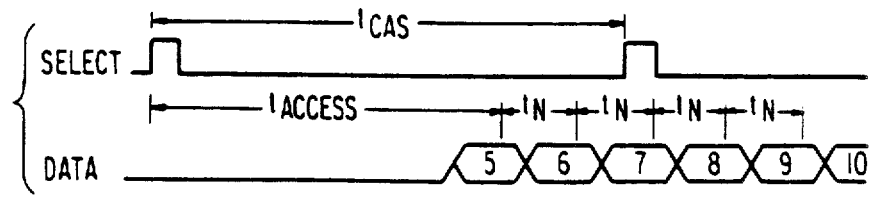
FIG. 5 is a timing diagram illustrating the gap time for a first starting address of a block transfer.
Figure 6:
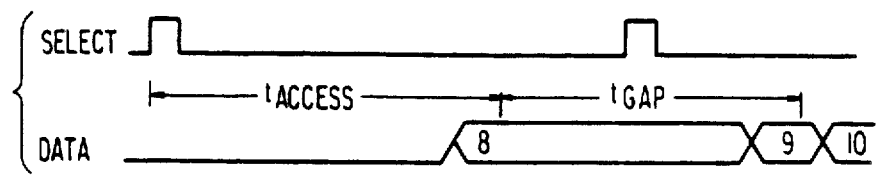
FIG. 6 is a timing diagram illustrating the gap time for a second starting address of a block transfer.
Figure 7:
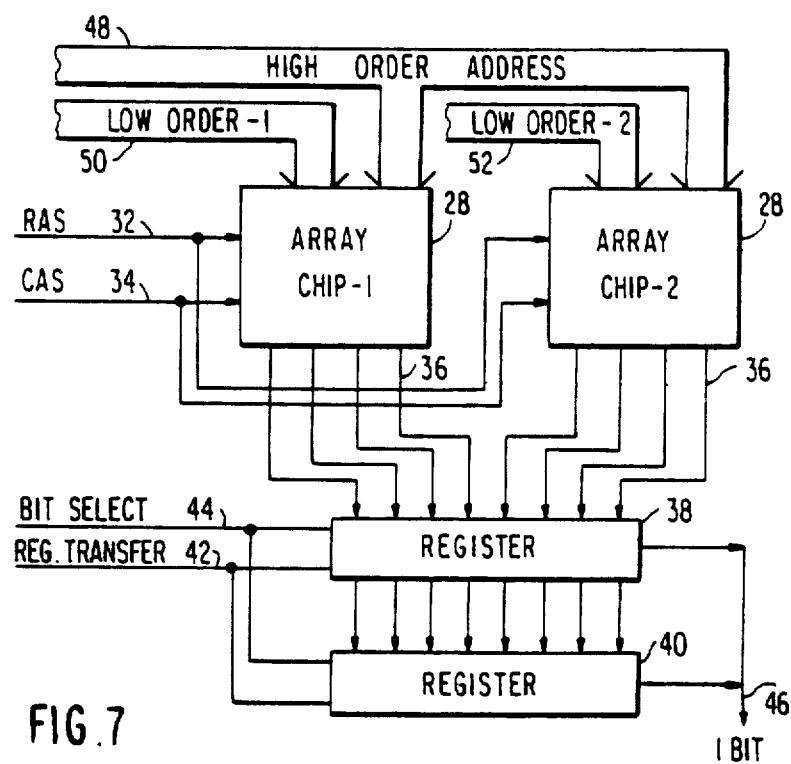
FIG. 7 is a block diagram of the memory system of the present invention.

In one embodiment of the present invention, shown in FIG. 7, there are a pair of array chips 28 of the same sort used in the system illustrated in FIG. 4. More than one pair of array chips 28 can be used for larger blocks or for array chips with less than four outputs. Each of the array chips 28 is selected by the same chip selection signals, a row address select signal RAS on a timing line 32 and a column address select signal CAS on a timing line 34. All of the four outputs 36 of a chip 28 are connected to a wide first register 38. Since there are two array chips 28, each having four outputs 36, the first register 38 has 8 inputs. The contents of the first register 38 can be transferred in parallel to a second register 40. This transfer can be performed very quickly, faster than the register reading rate period $t_N$, under the control of a register transfer signal on line 42. A bit select signal on an input line 44 selects which of the locations in which of the registers 38 and 40 is to be read onto a one-bit output line 46. Aichelmann, one of the inventors, has disclosed the use of two latches with multiple output memory chips in a technical article entitled "Memory Application of Multiple Bit Chips", appearing in the IBM Technical Disclosure Bulletin, Vol. 24, No. 4, September, 1981 at pages 2194–2196.

The locations within the array chips 28 which are to be transferred to the first register 38 are determined by the address inputs of the chips 28. However, the address inputs are different on the two array chips 28. The high order address inputs are commonly connected to a high order address bus 48. The low order address inputs, on the other hand, are connected to separate low order address buses 50 and 52. The separate low order address buses 50 and 52 allow different portions of the same neighborhood, determined by the high order address bus 48, to be transferred from the separate array chips 28 to the first register 38.

Figure 8:
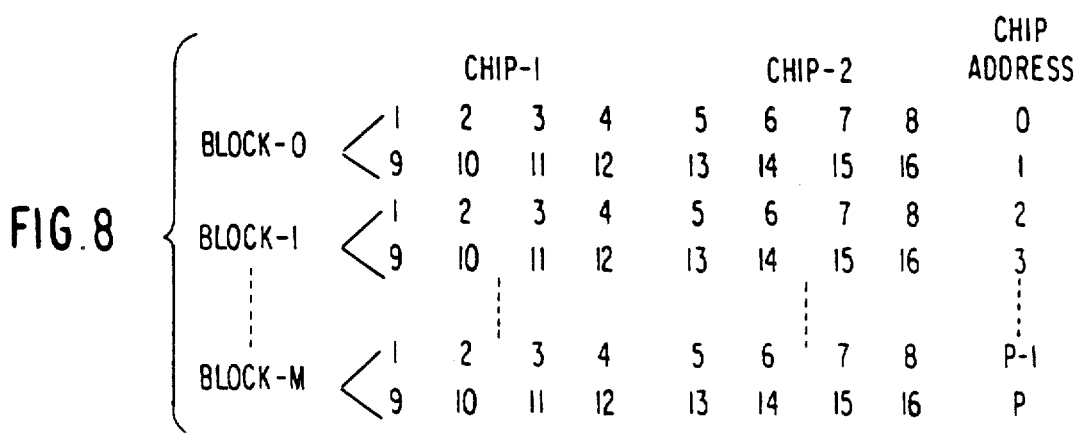
FIG. 8 illustrates the memory organization in the invention.

Consider the case where 16 bits of information, numbered 1 through 16 are stored in respective blocks in the two array chips 28. This memory organization is illustrated in FIG. 8. If there are two memory array chips 28 and the blocks each contain 16 bits, then the 2 chips can store blocks, numbered from 0 to M. Each of the chips has four data outputs for each of the addresses on that chip. If the requested block transfer begins with any of the locations numbered 1 through 4, then the transfer from the array chips 28 to the first register 38 takes the following sequence. In the initial fetch, the bits 1 through 4 are transferred from the first array chip 28 and the bits 5 through 8 are transferred from the second array chip 28. Then the bit select signal 44 begins to sequentially select these bits from the first register 38 beginning with the initial address 1, 2, 3 or 4 and then proceeding through the remaining bits.

At some point in the sequential selection, the bits in the first register 38 are transferred to the second register 40. This transfer need not interrupt the sequential serial transfer of the bits to the output line 46 at the register reading rate period $t_N$. Thereafter, the bit select signal selects bits from the second register 40 and completes the reading of the remaining bits including bit 8.

During the serial reading from the second register 40, a second transfer similarly transfers bits 9 through 16 in parallel into the first register 38. This sequence does not markedly differ from the prior art except for the larger number of bits that are read out of the register 38 before the second transfer. This means that the same low order addresses are applied to both of the array chips 28.

However, if the starting point of the block transfer begins with any of the bits 5 through 8, then the situation is somewhat different. The low order address bus connected to the second array chip causes the bits 5 through 8 to be transferred to the first register 38. A different low order address applied to the first chip, on the other hand, causes the bits 9 through 12 to be transferred in the initial fetch to the first register 38. The bit select signal then begins its sequencing with the indicated starting bit 5, 6, 7 or 8 and then selects the bits 5 through 12. During the serial reading of bits 5 through 12, the contents of the first register 38 are transferred to the second register 40. Then, before the completion of the reading of bit 12, a second transfer, with the low order address buses changed, causes bits 13 through 16 and 1 through 4 to be transferred into the first register 38. Bits 1 through 4 are transferred since the entire block must be read, thus requiring wrap around. The bit select signal continues selecting the bits in the first register 38 from the second transfer from the same point in the continuous sequence from which it left off in the initial fetch. This interleaved reading from the registers 38 and 40 prevents the development of a gap time if the chip reading rate period $t_{CAS}$ is no more than 5 times longer than the register reading rate period $t_N$.

It should be borne in mind that the circuitry of FIG. 7 is replicated 72 times for the ECC word although the RAS line 32, the CAS line 34, the address buses 48, 50 and 52, the register transfer line 42 and the bit select line 44 are common to the replicated circuitry. Also, it is possible that if more than M+1 blocks are required, then the higher block numbers and addresses can continue on other chips in well known ways.

The above description of the invention is somewhat functional and a more complete description of the circuitry for the practice of the invention requires a more concrete example of the memory organization. The bits within the two chips 28 are separately addressable by address $AA = A_L \ldots A_5 A_4 A_3 A_2 A_1 A_0$. The address bit $A_0$ is the lowest order bit. The two low order address bits $A_1 A_0$ address the four data outputs of a chip. The three lower address bits $A_2 A_1 A_0$ address the bits in either of the 8-bit registers 38 and 40. Thus, the third lowest address bit $A_2$ identifies one of the two array chips 20. The four lowest address bits $A_3 A_2 A_1 A_0$ address all of the bits within a block. The upper address bits $A_L \ldots A_5 A_4$ address the separate blocks. It is seen that the fourth lowest address bit $A_3$ determines one or the other of the two chip addresses for the block selected by the upper address bits $A_L \ldots A_5 A_4$.

It is thus seen that the high order address bus 48, shown in FIG. 7, carries the high order address bits $A_L \ldots A_5 A_4$. The two low order address buses 50 and 52 carry a bit corresponding to the fourth lowest bit $A_3$. However, the fourth lowest address bit may be different on the two low order addresses buses 50 and 52. These two potentially different bits will be identified respectively as $A'_3$ and $A''_3$. The bit select signal would be derived from the three address bits $A_2 A_1 A_0$ plus a signal identifying one of the two registers 38 and 40. Exactly how these address bits are applied will be described later.

Figure 9:
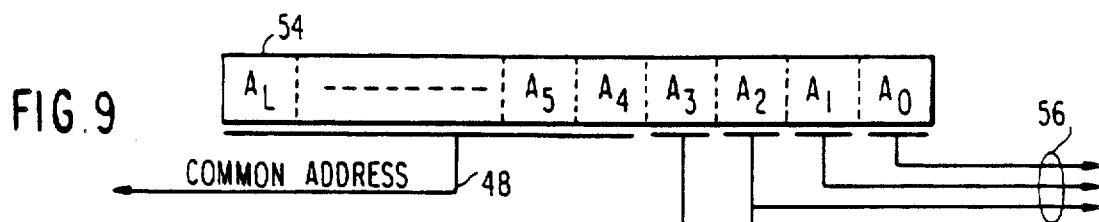
FIG. 9 is a block diagram of the addressing control for FIG. 7.

Circuitry which will provide the necessary addressing signals will now be described. The using system loads a target or starting address $AA = A_L \ldots A_5 A_4 A_3 A_2 A_1 A_0$ into a target address register 54 as shown in FIG. 9. This target address is the initial address within the desired block and also addresses the block itself. The upper address bits $A_L \ldots A_5 A_6 A_4$ are placed on the high order address bus 48 which is providing the common address to both of the array chips 28. The three lower bits $A_2 A_1 A_0$ are placed on three lines 56 to form a register target address, to be described in more detail later. The bits $A_3 A_2$ determine the interleaved reading of the array chips 28 and thus the values of the address bits $A'_3$ and $A''_3$ that are conveyed on the low order address buses 50 and 52. In the present configuration of the memory blocks and the number of array chips 28, each of the low order address buses 50 and 52 can consist of a single address line.

Figure 10:
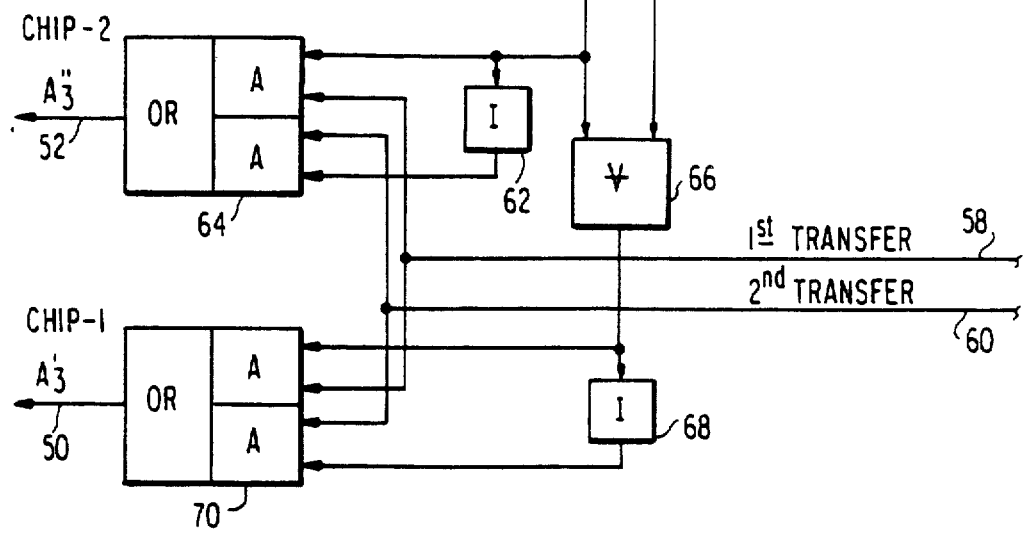
FIG. 10 is a truth table for the circuit of FIG. 9.

The values of the two address bits $A'_3$ and $A''_3$ that must be provided are given in the table of FIG. 10. The target bit is indicated in the first column. This is the initial address within the block and corresponds to the lowest four address bits $A_3 A_2 A_1 A_0$. The values of the address bits $A_3$ and $A_2$ are included in the next two columns. Dependent upon these values, the address bits $A'_3$ and $A''_3$ for the first transfer are given in the subsequent next two columns and those for the second transfer are given in the last two columns. The values of the address bits $A'_3$ and $A''_3$ are complemented between the first and the second transfer. Referring again to FIG. 9, a first transfer selection line 58 and a second transfer selection line 60 carry complementary signals that change on alternative accesses to the array chips 28 and indicate if the access is a first or a second transfer. The value of the address bit $A''_3$ for the second chip is the value of the address bit $A_3$ on the first transfer and its complement on the second transfer. This is accomplished by use of an inverter 62 so that true and complemented values of the address bit $A_3$ are led to respective AND gates whose outputs are combined in an OR gate in an AND/OR circuit 64. The other inputs of the AND gates are controlled by the first and second transfer selection lines 58 and 60. The output of the AND/OR circuit 64 is connected to the low order address bus 52 for the second chip and carries the signal $A''_3$.

For the address bit $A'_3$ for the first chip, the address bits $A_3$ and $A_2$ are compared in an exclusive-OR gate 66 which is the input to a similar configuration of an inverter 68 and an AND/OR circuit 70. The output of the AND/OR circuit 70 is connected to the low order address bus 50 to the first chip and carries the address bit $A'_3$. The circuitry of FIG. 9 conforms to the requirements of the table of FIG. 10.

Figure 11:
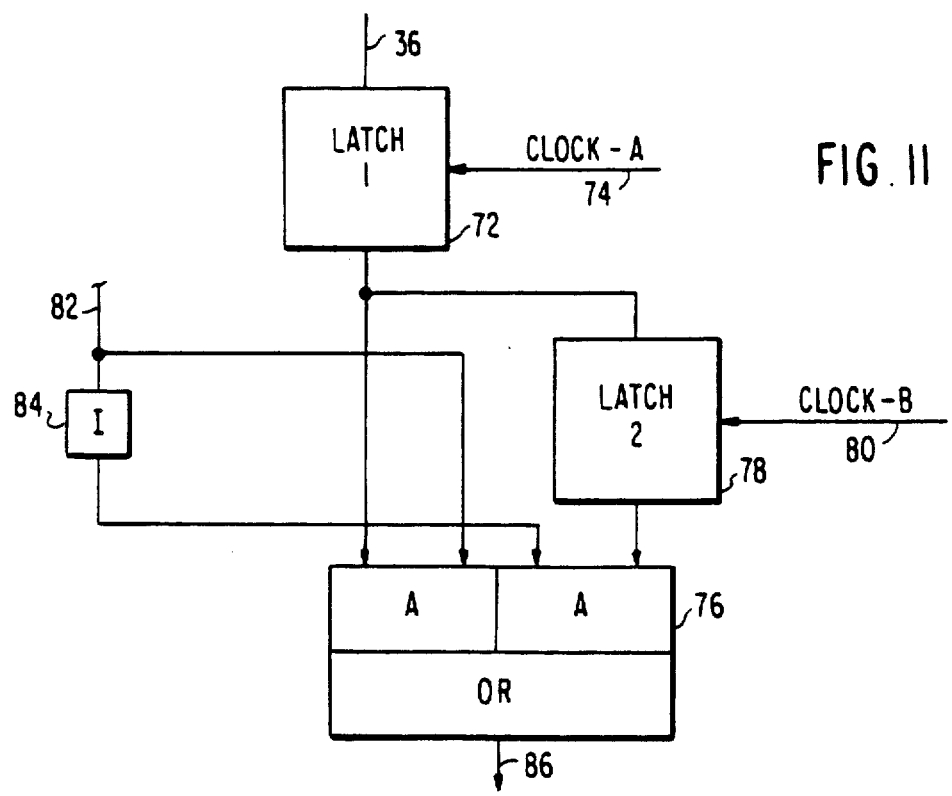
FIG. 11 is a block diagram of an embodiment of the double register of FIG. 7.
Figure 12:
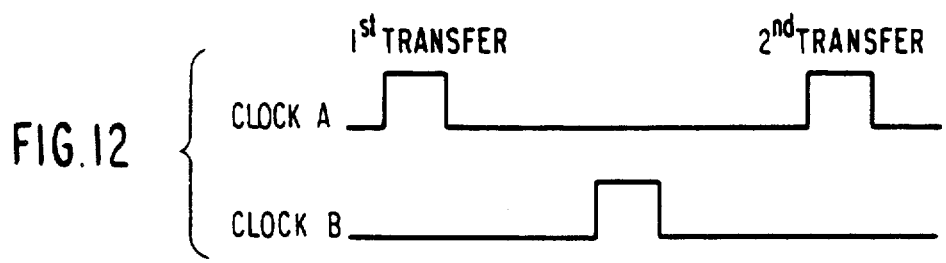
FIG. 12 is a timing diagram for the operation of the circuit of FIG. 11.

The two registers 38 and 40 are provided by the circuitry of FIG. 11, which illustrates only a single bit of the 8 bits shown in FIG. 7. In fact, the circuitry of FIG. 11 is included within the array chip 28 for many of the memory products made by the IBM Corporation. This structure is called a LSSD (Level Sensitive Scan Design) latch which is used for testing logic chips. FIG. 11 illustrates for a single bit that an unbuffered output bit is led on the output line 36 to a first latch 72 controlled by an A clock signal on a clock input line 74. The latch output of the first latch 72 is led to both an AND/OR circuit 76 and to a second latch 78 controlled by a B clock signal on another clock input line 80. The form of the two clock signals is given in FIG. 12. At the first occurrence of a clock A pulse, the first transfer is performed into the first latch 72. Thereafter, a pulse for the clock B signal causes the contents of the first latch 72 to be also latched into the second latch 78. Thereafter, a second pulse for the clock A signal causes a second transfer into the first latch 72. At that point, the reading of the array chips 28 for the one block is complete and all the data are available in the two latches 72 and 78.

Figure 13:
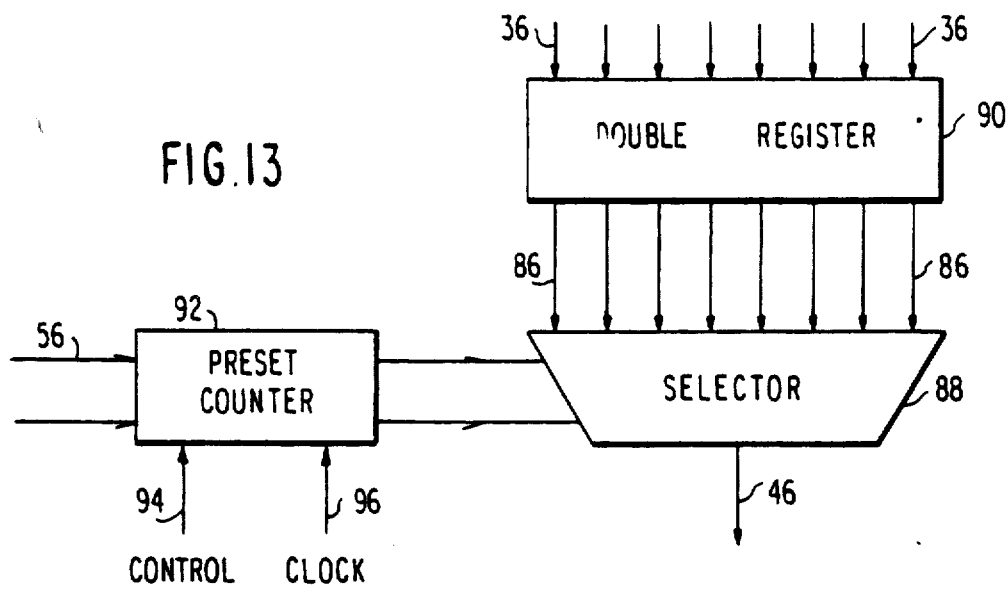
FIG. 13 is a block diagram of the serialization section of FIG. 7.

However, the first latch 72 can be read immediately after the occurrence of the first clock A pulse. A control signal on a gate path select line 82 determines which of the two latches 72 and 78 is being read from. Following the first clock A pulse, the control signal is true. The control signal is changed both by the occurrence of the clock B pulse and by the actual reading of the bit. Assuming that the bit has not yet been read when the clock B pulse occurs, the unread data is transferred to the second latch 78 so that the now false control signal is inverted by an inverter 84 to thereby select the second latch 78. Once the data in the second latch 78 has been read, the subsequent changing of the control signal reenables the reading of the first latch 72. The output of the AND/OR circuit 76 is connected to an output line 86 which is one of 8 inputs to a selector 88 shown in FIG. 13. A double register 90 is 8 of the circuits of FIG. 11. The selector 88 selects one of its 8 inputs 86 for connection to the single bit output line 46. The selector 88 is controlled by the counter output of a preset counter 92, which may be similar to the type SN54ALS190 manufactured by Texas Instruments. The counter 92 is preset by the register target address of the register target address bits $A_2A_1A_0$ on the lines 56. The presetting is controlled by pulsing a control input line 94. Once the counter 92 has been preset, a clock signal on a clock input line 96, operating at the register read rate $t_n$, increments the counter 92 in a wrap-around fashion to select another of the input lines 86 to the selector 88. A high order output of the counter 92 can be used for changing the control signal on the gate path select line 82.

The invention, as described above, avoids the disadvantages of gap times arising from the differing reading rates from the array chips and the buffers. The support circuitry is relatively simple and much of it can be shared by all 72 bits in the ECC word. The use of multiple-output memory arrays is thereby allowed for block transfers. The multiple-output memory arrays provide a reduced power dissipation since separate chips do not need to be enabled for each of the multiple bits. This reduction of power also reduces power surges associated with a parallel memory access. The use of the multiple outputs within the block then allows the 72 bits of the ECC word to be spread across different memory chips without affecting the error-correction capability. Also, the wireability is improved by the use of the multiple-output chips feeding a single bit output.

We claim:

1. A random access memory, for storing multi-word blocks of N-bit words, comprising:
    at least one single pair of memory array chips for each of N bit positions in said words, each of said chip pairs storing data for a respective bit position in said words in said multi-word blocks in the form of a plurality of contiguously stored bits output by said each chip pair over a first group and a second group of parallel output lines;
    a register, a first portion of which is connected by said first group of parallel output lines to a first one of said chips in said at least one pair of chips and a second portion of which is connected by said second group of parallel output lines to a second one of said chips in said at least one pair of chips;
    means responsive to a first address for applying in parallel a first group of bits from said first chip over said first group of output lines to said first portion of said register;
    means responsive to a second address for applying in parallel a second group of bits from said second chip over said second group of output lines to said second portion of said register;
    means for determining an arbitrary starting address for a block serial transfer of bits from said register in a predetermined sequencing order of addresses of said words; and
    means responsive to said determining means for providing said first and second addresses according to the value of said starting address to said first and second address responsive means, respectively, said first and second addresses producing said first and second groups of bits for a given word bit position in a given multi-word block to said register, wherein one of said first or second groups of bits contains at least the bit at said starting address, and the other of said first or second groups of bits contains a plurality of bits with addresses which consecutively follow in said predetermined sequencing order the last bit that consecutively follows from said starting address bit in said predetermined sequencing order in said one group of bits.

2. A memory as recited in claim 1, further comprising:
    means for sequentially transferring in said block transfer said bits applied to said register by said means responsive to said first and second addresses.

3. A memory as recited in claim 1, wherein said means for applying a first group of bits further comprises means for applying at least a third group of bits in said given multi-word block from said first chip over said first group of output lines to said first portion of said register.

4. A memory as recited in claim 1, wherein said means for applying a second group of bits further comprises means for applying at least a third group of bits in said given multi-word block from said second chip over said second group of output lines to said second portion of said register.

5. A random access memory system comprising a plurality of random access memory banks, each memory bank storing one bit of a word, each memory bank comprising:
    a plurality of memories each delivering a first plurality of data bits in parallel to a first plurality of outputs thereof, said memories having stored therein data distributed in predetermined blocks, each block being distributed over said plurality of memories and over a plurality of said first plurality of data bits within said memories, each of said data bits contained within said memories being addressed by a unique address;
    a register receiving on respective inputs all of said first plurality of data bits from all of said first plurality of outputs of all of said plurality of memories; and
    transfer control means responsive to a first address for transferring all data bits in one of said blocks containing one of said data bits addressed by said first address from said memories to said register in multiple access cycles, said transfer control means transferring in a first one of said multiple access cycles said data bit addressed by said first address in combination with bits consecutively following said addressed data bit in said predetermined sequencing order, with some of said consecutively following bits being in a memory in said plurality of memories that is different from the memory containing said addressed data bit, and also transferring remaining ones of said all data bits in a predetermined sequencing order in subsequent ones of said multiple access cycles.

6. A random access memory system as recited in claim 9, wherein each of said memories has a higher order address input and a lower order address input and wherein said transfer control means includes means for applying a higher order part of said first address to said higher order address input of said memories and comprises means for logically combining at least two bits of a medium order part of said first address with a signal representing a sequencing of said multiple access cycles to form a plurality of combined address signals, said combined address signals being applied to said lower order address inputs of respective ones of said memories to control which data bits are accessed in said multiple access cycles.

7. A memory system as recited in claim 6, further comprising means for serially reading data from said register including a counter having a preset input to which a lower order part of said first address is applied.

8. A random access memory as recited in claim 1, wherein each of said memory array chips has a higher order address input and a lower order address input and wherein said means for providing said first and second addresses includes means for applying a higher order part of said first address to said higher order address input of said memory array chips and comprises means for logically combining at least two bits of a medium order part of said first address with a signal representing a sequencing of multiple access cycles to form a plurality of combined address signals, said combined address signals being applied to said lower order address inputs of respective ones of said memory array chips.

9. A random access memory as recited in claim 1:
wherein said register is a first register; and
further comprising a second register receiving in parallel outputs of said first and second portions of said first register, a number of locations in said first register being equal to a number of location in said second register.

10. A random access memory as recited in claim 5, wherein said register is a first register, said random access memory further comprising:
a second register receiving in parallel outputs of said first and second portions of said first register, a number of locations in said first register being equal to a number of locations in said second register; and
means for serially reading data from said first and second registers, said serially reading means including a counter having a preset input.

* * * * *